(12) United States Patent
Bolle et al.

(10) Patent No.: US 7,254,034 B2
(45) Date of Patent: Aug. 7, 2007

(54) THERMAL MANAGEMENT FOR SHIELDED CIRCUIT PACKS

(75) Inventors: Cristian A Bolle, Bridgewater, NJ (US); Marc Scott Hodes, New Providence, NJ (US); Paul Robert Kolodner, Hoboken, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 274 days.

(21) Appl. No.: 11/013,054

(22) Filed: Dec. 15, 2004

(65) Prior Publication Data

US 2006/0126309 A1 Jun. 15, 2006

(51) Int. Cl.
*H05K 7/20* (2006.01)

(52) U.S. Cl. .................. 361/719; 361/704; 361/707; 165/80.3; 165/185; 257/712

(58) Field of Classification Search ............ None
See application file for complete search history.

(56) References Cited

U.S. PATENT DOCUMENTS

| | | | | |
|---|---|---|---|---|
| 5,910,524 A | * | 6/1999 | Kalinoski | 523/215 |
| 6,065,530 A | * | 5/2000 | Austin et al. | 165/80.3 |
| 6,075,205 A | * | 6/2000 | Zhang | 174/358 |
| 6,084,178 A | * | 7/2000 | Cromwell | 174/383 |
| 6,396,701 B1 | * | 5/2002 | Nakamura et al. | 361/706 |
| 6,707,675 B1 | * | 3/2004 | Barsun et al. | 361/704 |
| 6,744,640 B2 | * | 6/2004 | Reis et al. | 361/818 |
| 6,816,376 B2 | * | 11/2004 | Bright et al. | 361/704 |

OTHER PUBLICATIONS

Kolodner, P. et al., "Efficient Cooling of Multiple Components in a Shielded Circuit Pack," Proceedings of IPACK2005: InterPACK '05, 8 pages, Jul. 17-22, San Francisco, CA.

* cited by examiner

*Primary Examiner*—Boris Chervinsky

(57) ABSTRACT

A thermal management for EMI shielded circuit packs having one or more high-power components, i.e. heat sources. More particularly, a heat transfer device or assembly for EMI shielded circuit packs is provided whereby multiple components (e.g., high-power components) are cooled by individual heat sinks (i.e., each component has its own individual heat sink) which protrude into an external airflow through individual openings in the lid of the EMI shield. Mechanically-compliant, electrically-conductive gaskets are used to seal the base plates of the individual heat sinks against the lid of the EMI shield enclosure. As such, in accordance with the various embodiments, the conductive gaskets establish a compliance layer which accommodates any variation in the heights of the individual components, thereby, allowing optimum thermal contact between the components and their respective heat sinks without compromising the EMI shielding.

19 Claims, 7 Drawing Sheets

THERMAL MANAGEMENT FOR SHIELDED CIRCUIT PACKS

FIELD OF THE INVENTION

The present invention relates generally to heat removal from electronic devices and, more specifically, to improved thermal management for electronic devices mounted in electromagnetic interference (EMI) shielded circuit packs.

BACKGROUND OF INVENTION

Circuit packs and modules typically have one or more printed circuit board (PCB)-mounted integrated circuits (ICs) that dissipate enough heat that cooling by simple, un-enhanced natural convection, radiation and/or by heat conduction through the PCB is insufficient to keep junction temperatures below maximum operating limits. Generally, cooling of these ICs may be obtained by thermally connecting them to heat-dissipating structures, such as heat sinks, which in turn may be cooled by forced air when necessary.

Cooling using this general technique, however, is not always easy to achieve. For instance, variations in IC stack-up height and parallelism to the PCB present notable problems. For example, circuit packs utilized in high-speed optoelectronic and wireless communications applications have high-power components that must have EMI shielding. Given the EMI shielding requirements, these types of components are typically mounted on a PCB enclosed within a sealed aluminum box (i.e., the EMI shield) and mounted on racks within a certain product configuration (for example, the MetroEON™ product, commercially available from Lucent Technologies Inc. of Murray Hill, N.J.). However, air circulated by cooling fans in such products cannot penetrate the EMI shield thereby leading to disastrous results. For example, due to the high thermal resistance between such components their ambient component temperatures can be too high to achieve the desired product and individual component reliability and performance. Further, and potentially more damaging, elevated temperatures can destroy the components at certain higher temperature levels.

One way to combat the aforementioned heat build up is to provide a low thermal resistance path between the components (e.g., high-power ICs) within the EMI shield and a heat sink structure (e.g., a heat-spreader plate or cooling fins) external to the EMI shield. However, a problem that may be encountered in making a proper thermal connection between the ICs and the heat sink is that the distance between the heat sink and the ICs can vary, both because of IC stack-up height variations and because of thermal expansion of the entire assembly. As such, it is often difficult to achieve a proper, reliable contact between surfaces to maintain a good thermal path. Additionally, the two surfaces to be thermally connected may not be sufficiently parallel and in fact may shift relative to one another as the assembly is transported, or thermally or mechanically stressed. Typically, these height variations and misalignments may be compensated for by use of thermal gap fillers or thick layers of thermal grease, both of which have low thermal conductivity (e.g., 1-8 Watts per meter-Kelvin (W/m-K)). However, thermal gap fillers and thermal grease layers add considerable thermal resistance between a component and the ambient air surrounding such component (such ambient air, as will be well understood by those skilled in the art, forming the component's ultimate heat sink). Unfortunately, this results in an undesirably large increase in component temperatures. Moreover, in practice, the thermal grease is squeezed out of the gap as the components are pressed together, and then, if the gap re-opens up it cannot refill the gap. Thus, the thermal resistance of the gap can actually be much higher than if completely filled with thermal grease.

Therefore, it would be desirable to have a low thermal resistance heat dissipation technique to accommodate for the variations and dynamics of individual components mounted in EMI shielded circuit pack arrangements.

SUMMARY OF THE INVENTION

Accordingly, we have realized a heat transfer device or assembly which delivers effective thermal management for EMI shielded circuit packs having one or more high-power components, i.e., heat sources.

More particularly, the aspects of the present invention provide a heat transfer device or assembly for EMI shielded circuit packs whereby multiple heat sources (e.g., high-power components) are cooled by an individual heat-dissipating structure (e.g., a heat sink) which protrudes, in part, into an external airflow through individual openings in the lid of the EMI shield. That is, each heat source has its own individual heat sink. Importantly, in accordance with the principles of the invention, mechanically-compliant, electrically-conductive gaskets are used to seal the base plates of the individual heat sinks against the lid of the EMI shield enclosure. As such, in accordance with the various aspects of the invention, the conductive gaskets establish a compliance layer which accommodates any variation in the heights of the individual components, thereby, allowing optimum thermal contact between the components and their respective heat sinks without compromising the EMI shielding. That is, in accordance with the principles of the invention, the mechanically-compliant layer (sometimes alternatively referred to herein as the "compliance layer") of the heat transfer assembly is external to the thermal path delivered thereby. Significantly, as the compliance layer is not in the thermal path this allows for the application of an optimally thin layer of thermal grease at the interface of the component and its respective heat sink. Further, the gaskets of the invention are mechanically compliant and allow the entire circuit packet assembly to adapt to dimensional variations without adversely affecting the thermal path. Importantly, solid-to-solid contact (e.g., the top of the IC package to the bottom plate of the heat sink) is maintained along the entire IC/heat sink contact area thereby keeping thermal resistance at a very low level.

Advantageously, the heat transfer device/assembly of the present invention provides a certain adaptability to physical variations in EMI shielded circuit packs (e.g., component gaps, component height variations and misalignment) while improving the thermal management achieved within such circuit packs. Importantly, in accordance with the principles of the invention, the mechanically-compliant layer of the heat transfer assembly is external to the thermal path. Said another way, the mechanically-compliant layer of the heat transfer assembly is physically separated from the thermal path delivered thereby but is integral with the EMI shield. Further, advantageously, efficient cooling is achieved in that the individual heat sinks can be tailored to the thermal load associated with their respective component. Additionally, the set of individual heat sinks, in accordance with the principles of the invention, can present a lower thermal resistance to the cooling airflow than a conventional configuration of fins covering the entire lid of the EMI shield (see, for example, FIG. 1C). Also, improved serviceability of circuit packs is achieved due to the need of only removing the lid (which is not adhered to the rest of the circuit pack by layers of thermal grease or thermally-conductive adhesive) and, if necessary, the heat sinks from components under repair. Thus, the mechanical stresses encountered upon opening the circuit pack for inspection and/or repair are modest, and the circuit pack can remain powered, with appropriate cooling, while under inspection and/or repair.

These and other objects, features and advantages of the present invention will become apparent to those of ordinary skill in the art from the following detailed description of illustrative embodiments thereof, which is to be read in connection with the accompanying drawings.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION OF THE INVENTION

Figure 1A:
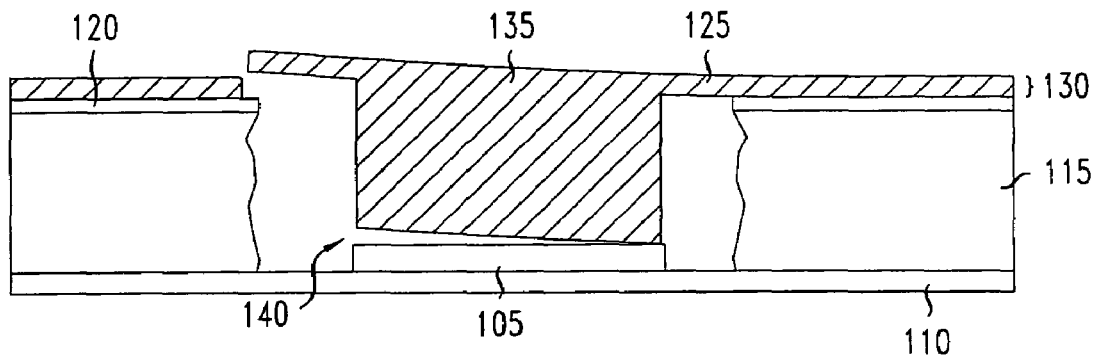
FIGS. 1A, 1B and 1C show, in cross-sectional view, known heat transfer assemblies which present certain thermal management challenges.
Figure 1B:
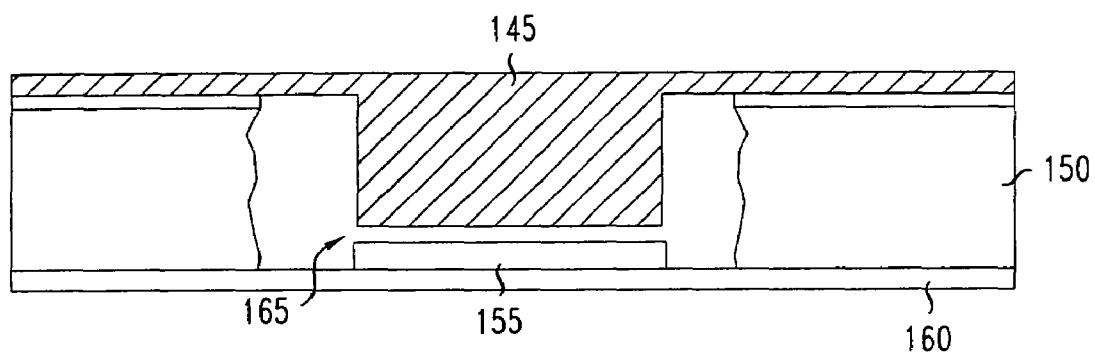
Figure 1C:
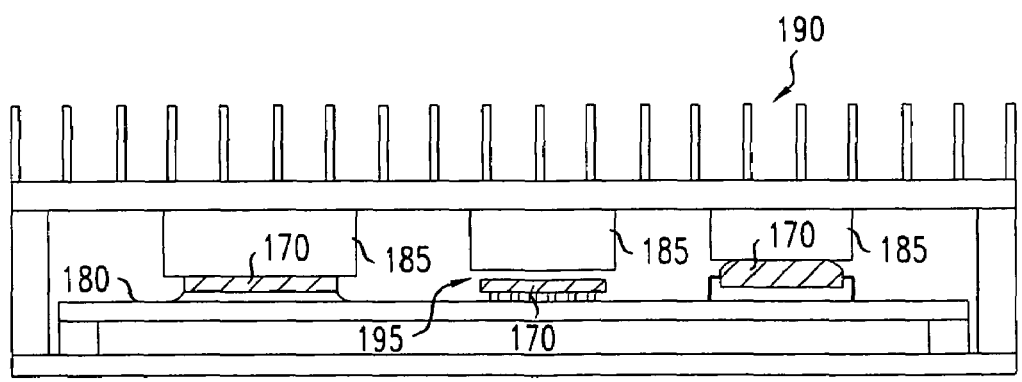

Prior to describing the various aspects and embodiments of the present invention, and to further appreciate the heat dissipation solution enabled thereby, FIGS. 1A, 1B and 1C show known heat transfer assemblies which present certain thermal management challenges, as discussed above. More particularly, the heat transfer assembly of FIG. 1A centers on the notion of dimensioning the EMI shield box such that the IC component is always "too tall", and to use a spring-like structure to make a mechanically compliant connection between the IC component package and the lid of the EMI shield box. As will be appreciated while FIG. 1A (and FIG. 1B and FIG. 1C) is shown, illustratively, with ICs, it will be understood that there are any number of alternative heat sources which can be substituted therefore. More particularly, as shown in the cross-sectional view of FIG. 1A, IC 105 is mounted to PCB 110 which is, in turn, enclosed within EMI shield box 115 having lid 120 (fabricated, illustratively, from aluminum). As shown in FIG. 1A, lid 120 also functions as a heat sink to the ambient air. In order to address the heat dissipation problem in this configuration, compliant structure 125 is used as a spring-like structure to make the mechanically compliant connection between the package of IC 105 and lid 120. More particularly, compliant structure 125 is defined through a U-shaped cut in a heat-spreader plate 130 (fabricated, illustratively, from copper) mounted on top of EMI shield 115 (and lid 120). Further, compliant structure 125 presses heat-transfer block 135 (fabricated, illustratively, from copper) against the top of the package of IC 105. Thus, compliant structure 125 is able to ensure some thermal contact to the package of IC 105 but still results in less than optimal thermal management due to the resulting gap 140.

That is, the assembly shown in FIG. 1A suffers from certain mechanical and thermal resistance drawbacks, the most significant of which is that, due to inevitable variations in IC heights, there will always be a wedge-shaped gap (see, e.g., gap 140 in FIG. 1A) between the top of the IC (e.g., IC 105) package and the bottom of heat transfer block (e.g., heat transfer block 135) once the two are in contact. The high thermal resistance of gap 140 is only slightly reduced by attempting to fill gap 140 with a well-known thermal gap filler or thermal grease layer (e.g., Thermagon T-flex 6310™, a commercially available compliant thermal gap-filler material or a commercially available thermal grease such as Thermagon T-grease 401™). If, for example, thermal grease is used to fill wedge-shaped gap 140, it can be squeezed out of the gap during assembly. During the initial assembly, the two surfaces are nearly parallel as they are pressed together; thus expelling the grease. Then, as the wedge-shaped gap opens up, air pockets devoid of grease can then form in the gap, resulting in higher thermal resistance than would be obtained if the gap were completely filled with thermal grease. Furthermore, the thermal grease that is squeezed out of the gap as the heat-transfer block is pressed against the component can undesirably spill onto the PCB and cause problems with high frequency leads it covers, for example.

FIG. 1B shows another known heat transfer device consisting of a fixed heat transfer block 145 having a lower surface which is parallel to, but separated from, an upper surface of IC 155 which is mounted on PCB 160 within EMI shield 150. As shown, this assembly result in the formation of gap 165 between fixed heat transfer block 145 and IC 155 which will require a gap filler (e.g., a thermal gap filler or thermal grease) of considerable thickness to bridge gap 165. As discussed above, the necessity of such a large amount of low-thermal-conductivity filler material is less than ideal in terms of thermal management characteristics, in particular, thermal resistance.

FIG. 1C shows another known heat transfer assembly consisting of multiple heat sources 170 (illustratively shown as individual ICs and their associated packages) mounted on PCB 180 within EMI shield enclosure 190 having heat-transfer fins which extend externally across the entire length of the EMI shield's lid. Importantly, FIG. 1C illustrates the basic problem with such multi-component EMI shielded circuit packs which invariably have variations in chip height amongst the heat sources which lead to gaps (for example, gap 195) between the top of a heat source and the bottom of a heat-transfer block (for example, heat-transfer blocks 185). Again, such gaps require a thermal grease layer as a filler of the resultant air gap which, as detailed above, results in poor thermal resistance characteristics.

In recognition of the above-described thermal management problems, the present Applicants have realized a heat transfer device or assembly which delivers improved thermal management for EMI shielded circuit packs having one or more multiple high-power components. More particularly, the various aspects of the present invention provide a heat transfer device or assembly for EMI shielded circuit packs whereby multiple components (e.g., high-power components) are cooled by individual heat sinks (i.e., each component has its own, and is in thermal contact with, individual heat sink) which protrude, in part, into an external airflow through individual openings in the lid of the EMI shield. Importantly, in accordance with the principles of the invention, mechanically-compliant, electrically-conductive gaskets are used to seal the base plates of the individual heat sinks against the lid of the EMI shield enclosure. As such, in accordance with the various aspects of the invention, the conductive gaskets accommodate any variation in the heights of the individual components, thereby, allowing optimum thermal contact between the components and their respective heat sinks without compromising the EMI shielding.

Significantly, as the mechanically-compliant layer is not in the thermal path, this allows for the application of an optimally thin layer of thermal grease at the interface between the component and its respective heat sink. Thus, in accordance with the principle advantages of the invention, the use of compressible gaskets allows for the application of optimally thin thermal grease layers which serve principally to fill microscopic voids in each of the solid surfaces (i.e., the component surface and the heat sink surface). This is in contrast to prior art use of thick thermal grease layers which are used to fill large air gaps between such surfaces thereby resulting in non-optimal thermal performance.

Further, in addition to compensating for any height variations, the gaskets of the present invention are electrically-conductive and integral with the EMI shield such that the gasket forms part of the EMI shield. Thus, the electrically-conductive, mechanically-compliant gaskets of the invention thereby allow the entire circuit packet assembly to adapt to dimensional variations without adversely affecting the thermal path or compromising the effectiveness of the EMI shielding. Importantly, solid-to-solid contact (e.g., the top of the component package to the bottom plate of the heat sink) is maintained along the entire interface, thereby keeping thermal resistance at a very low level. In addition, the thermal grease layer is optimally thin and primarily functions to fill air voids where the two nominally flat surfaces are not in complete contact.

Figure 2A:
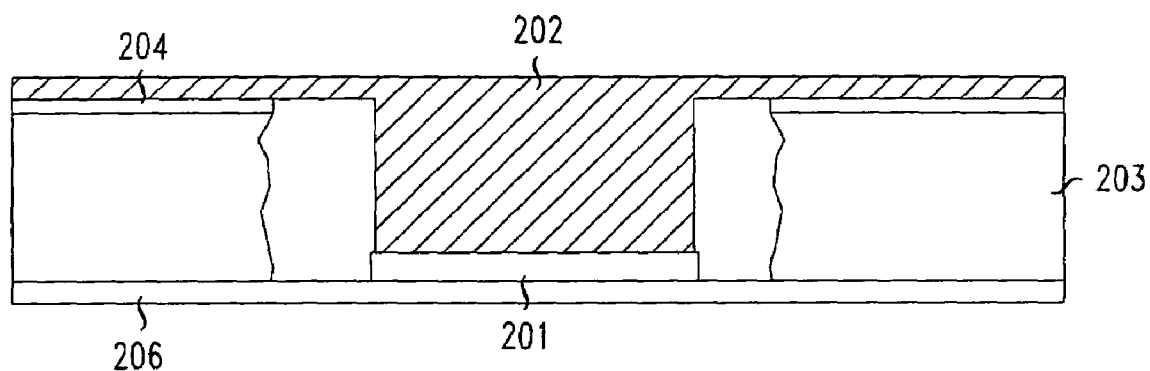
FIGS. 2A and 2B show, in cross-sectional view, illustrative assemblies having heat transfer devices configured in accordance with the principles of the present invention.
Figure 2B:
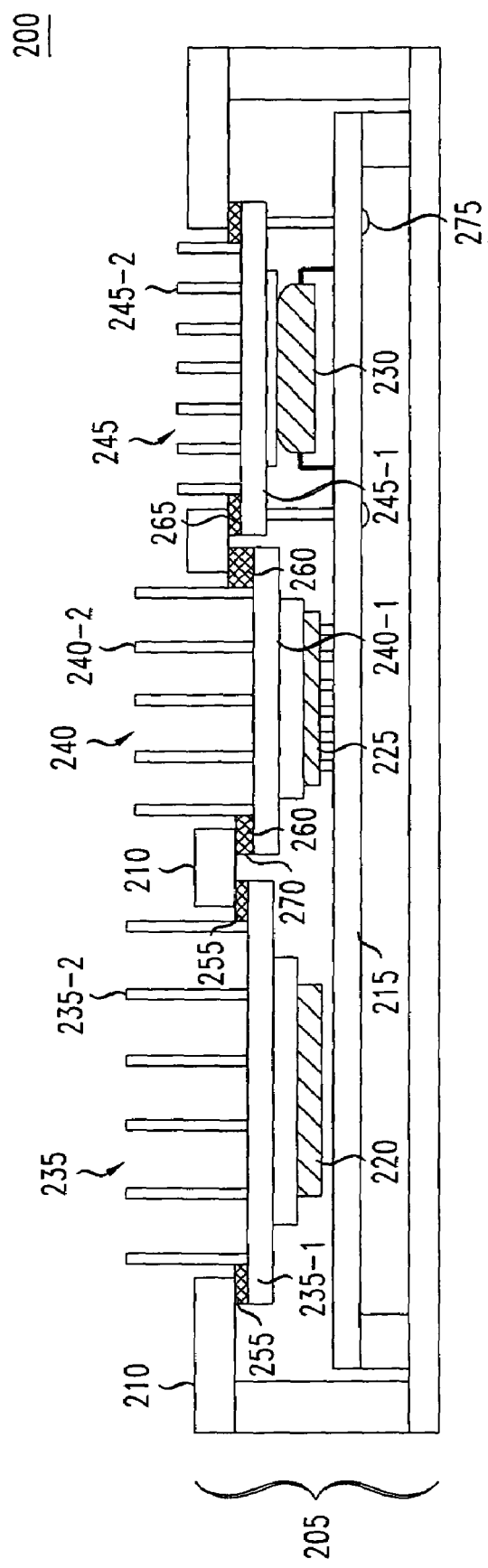

FIG. 2A and FIG. 2B show, in cross-sectional view, illustrative assemblies having heat transfer devices configured in accordance with the principles of the present invention. In particular, FIG. 2A illustrates, at a basic level, the thermal management solution realized by the present invention. As shown in FIG. 2A, heat source 201, as mounted on PCB 206 within EMI shield 203, is thermally connected to heat-transfer block 202 without any resultant gap between the two (contrast this with the assembly shown in FIG. 1B). Advantageously, in accordance with an aspect of the invention, gasket 204 is disposed between a particular portion of EMI shield 203 and heat-transfer block 202 which eliminates any gap due to height variations of heat source 201. Further, in accordance with the invention, gasket 204 (in addition to compensating for any height variation due to its mechanical compliance) is electrically-conductive and integral with EMI shield 203 such that gasket 204 forms part of the EMI shield. Importantly, the thermal contact between the heat-dissipating structure (i.e., heat-transfer block 202) and its associated heat source (i.e., heat source 201) will include a thermal grease layer such that the thermal grease layer is of a minimal thickness to establish optimal thermal contact along the entire contact area shared between the heat sink and the heat-dissipating structure connected therewith. The import of the invention will be further understood in the context of a multi-component circuit pack assembly which is the subject of FIG. 2B.

FIG. 2B shows, in cross-sectional view, an illustrative assembly comprising multiple heat sources and having a heat transfer device 200 configured in accordance with the principles of the present invention. As shown, EMI shield 205 has lid 210 (illustratively, formed from aluminum) into which three openings have been punched. As will be appreciated, for ease of discussion and illustration herein a limited number of heat sinks/holes are shown in FIG. 2B, however, it will be understood that the principles of the present invention are equally applicable to a smaller or larger number of heat sinks/openings. Protruding through such openings (e.g., holes) are heat sink 235 (having heat-transfer fins 235-2), heat sink 240 (having heat-transfer fins 240-2) and heat sink 245 (heat-transfer fins 245-2), respectively. In accordance with an aspect of the invention, the individual heat sinks 235-245 are each associated with a respective different one component. It will also be understood that in further embodiments of the invention one heat sink may bridge multiple components. It will also be understood that in further embodiments of the invention the heat sinks have a finned or unfinned construction. Illustratively, heat sinks 235-245 are formed from black-anodized, extruded aluminum, as commercially available from CoolerMaster Co., Ltd.

As shown in FIG. 2B, component 220 is associated with heat sink 235, component 225 is associated with heat sink 240 and component 230 is associated with heat sink 245. As will be understood, components 220-230 will have conventional IC packages. In accordance with an aspect of the invention, each individual component is associated with a particular heat sink which is configured in accordance with the specific thermal management requirements of that component (i.e., heat source). As will be appreciated, components 220-230 can be any type of component requiring thermal management such as microprocessors, field programmable gate arrays (FPGA), transceivers, lasers, laser drivers, clock/data recovery devices, to name just a few. That is, according to the principles of the invention herein, a heat source may comprise any electronic or photonic device, including, but not limited to, various types of ICs.

As shown in FIG. 2B, components 220-230 are mounted, in a conventional manner, to PCB 215 to make electrical connections thereto pursuant to the circuit configuration delivered by the circuit pack. As can be seen in assembly 200, components 220-230 have varying height variations, for example, height variation 270 associated with component 225. In addition, as will be understood, assembly 200 also incurs component height variations measured between the top of PCB 215 and the top of individual components mounted thereto (e.g., component 225). Thus, in accordance with the principles of the invention, the individual heat sinks 235, 240 and 245 are held in place by mechanically-compliant, electrically-conductive gaskets which, in turn, compensate for the variations in the heights of components 220-230 and ensure the delivery and electrical continuity of EMI shield 205.

In particular, in accordance with this embodiment of the invention, the component 220/heat sink 235 combination is supported by gasket 255, the component 225/heat sink 240 is supported by gasket 260 and the component 230/heat sink 245 combination is supported by gasket 265. As shown in FIG. 2B, each gasket is disposed between the underside of lid 210 and the base of each heat sink (i.e., heat sink base 235-1, 240-1 and 245-1, respectively). Illustratively, such gaskets are formed from an EMI gasket material such as the commercially available Chomerics S6304 high-density, nickel-graphite-filled silicone elastomer which has a maximum compression of thirty percent (30%) and a thermal conductivity of 2.6 W/m-K. As will be appreciated, such gaskets, in addition to compensating for the variations in the heights of components 220-230, also serve to provide the pressure necessary to improve mechanical contact between individual components and their respective heat sink thereby improving overall thermal management. Illustratively, if the compression of the gaskets is thirty percent, the variation in component heights can only be approximately thirty percent of the overall gasket thickness. In accordance with further embodiments of the invention, the heat sinks can also be mechanically attached to the IC package of the component or the PCB itself (see, for example, fastener 275 which clamps heat sink 245/component 230 to PCB 215).

In accordance with the embodiment of the invention shown in FIG. 2B, the gaskets (i.e., gaskets 255, 260 and 265) are all of variable size which allows for uniform thicknesses of the bases of heat sinks 235, 240 and 245. In further embodiments of the invention, the gaskets can be of uniform size with size variability across the heat sink bases. Further, in accordance with alternative embodiments of the invention, an optimally thin thermal grease layer is employed between the individual heat sinks and their associated components. Again, as discussed above, due to the fit compliance delivered by the heat transfer assembly of the present invention, the thermal inefficiency due to any loss of the thermal grease layer between the heat transfer block/component interface is greatly reduced.

In addition to the above-described advantages, the heat sink assembly of the present invention provides further advantages such as: (1) an increase in cooling efficiency due to the tailoring of individual heat sinks to their associated thermal load; (2) a lower resistance to the flow of cooling air than a conventional configuration of fins covering the entire lid of the EMI shield; (3) greatly reduced mechanical stress on components due to the compliance of the EMI gaskets thereby reducing the risk of damaging IC packages; (4) virtual elimination of stress concentrations as uniform pressure is applied over individual component footprints; and (5) improved serviceability of the circuit packs since the lid can be removed without removing the heat sinks.

Figure 3A:
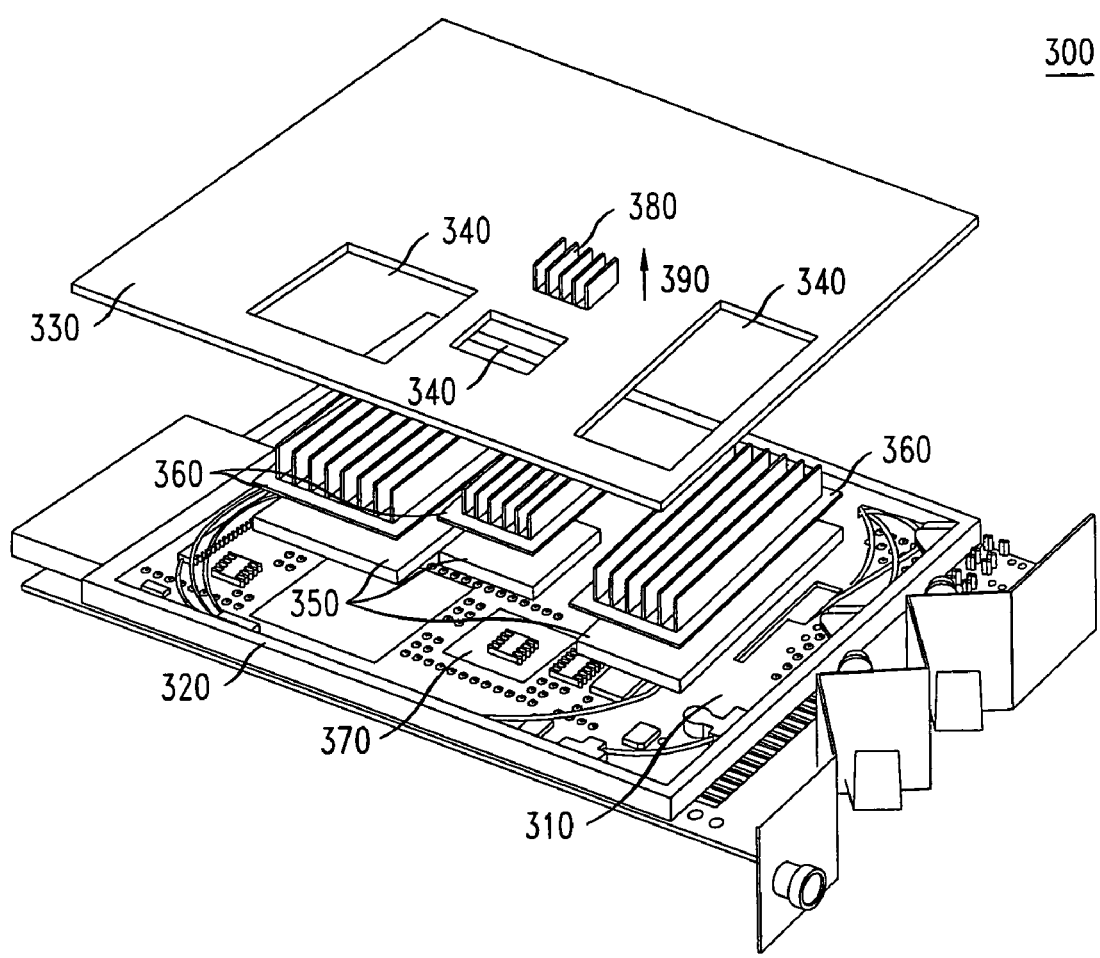
FIGS. 3A, 3B and 3C show various views of two illustrative circuit packs employing the heat transfer principles of the present invention.
Figure 3B:
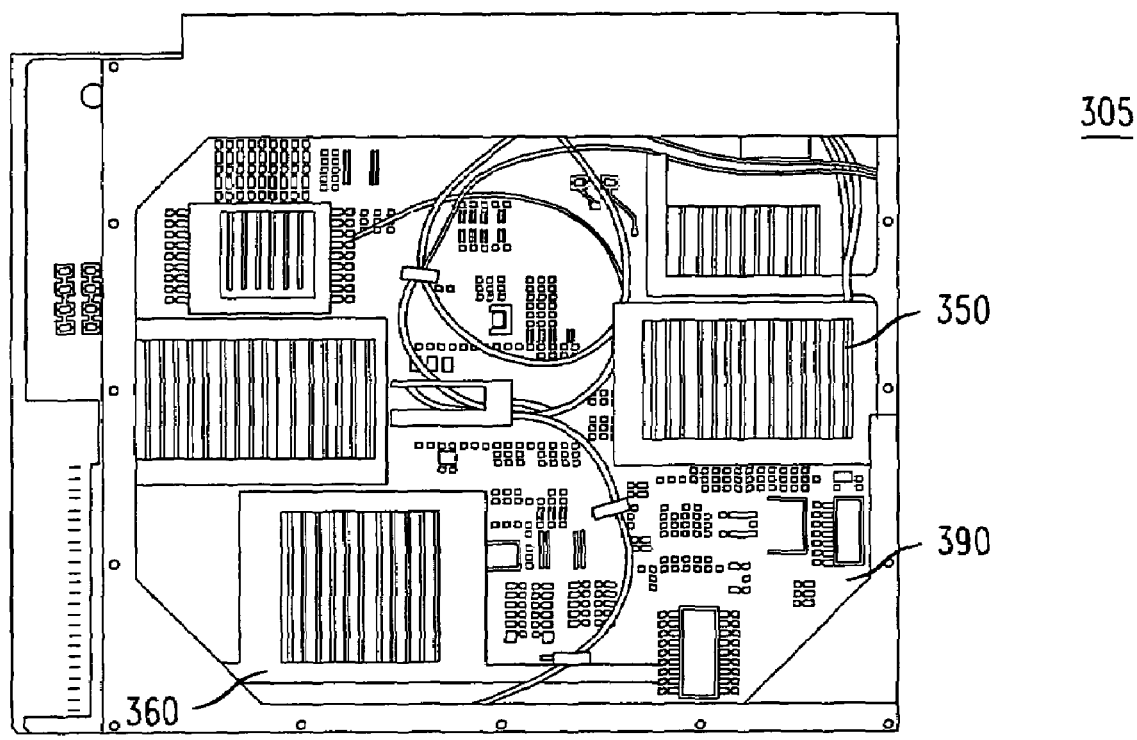
Figure 3C:
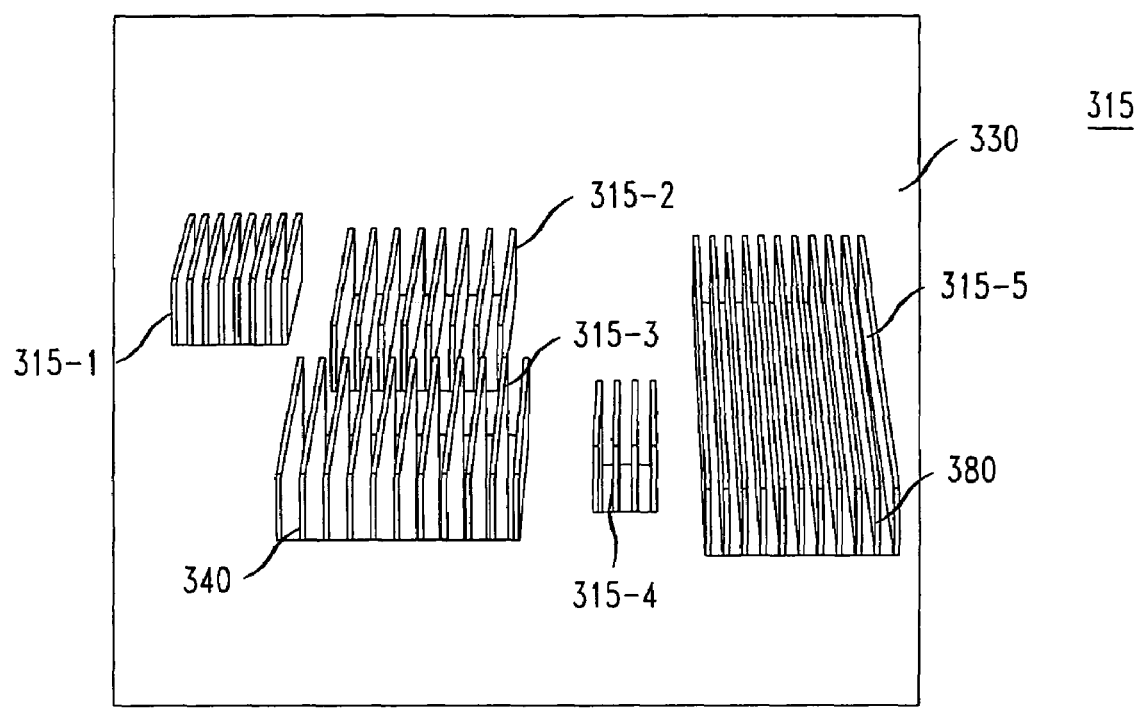

In order to further appreciate the above-described aspects of the invention and the advantages thereto, FIGS. 3A, 3B and 3C show various views of two illustrative circuit packs employing the heat transfer device of the present invention. More particularly, FIG. 3A shows an EMI shielded circuit pack assembly 300 having PCB 310 enclosed by EMI shield 320. Some of the structures presented herein in FIGS. 3A-3C are chosen as representative of the circuit pack assemblies employed in the aforementioned MetroEON™ product. EMI shield 320 includes lid 330, illustratively formed from aluminum, having rectangular openings 340 which have been, illustratively, punched into lid 330 in a conventional manner. In accordance with principles of the invention, the individual components mounted on PCB 310 (e.g., component 370) each have an individual heat sink 350 which, in turn, are supported by gaskets 360 which are disposed between the underside of lid 330 and the base of each heat sink 350. As shown in FIG. 3A, when fully assembled, heat-transfer fins 380 protrude through openings 340 in lid 330 thereby being exposed to an external cooling airflow (for example, an airflow in direction 390 across the top of lid 330 and parallel to the heat-transfer fins). As will be appreciated, the source of such cooling airflow is, illustratively, fan(s) associated with a cabinet (or rack) in which EMI shielded circuit pack assembly 300 is mounted. It will also be appreciated that in further applications of the present invention, the fins are cooled by natural convection thereby eliminating any need for fans (or other mechanical airflow sources).

Continuing with discussion of EMI shielded circuit pack assembly 300, FIG. 3B shows a top view 305 of an alternative circuit pack assembly without a lid, thereby exposing PCB 390, which is shown, illustratively, having five (5) components configured with heat sink 350/gasket 360 assemblies in accordance with principles of the invention. Further, FIG. 3C shows an oblique view 315 of EMI shielded circuit pack assembly 300 (as shown in FIG. 3A) with a fully assembled lid 330 whereby the fins 380 of each of the five heat sink 350 are shown protruding through holes 340 in lid 330. For ease of illustration, it should be noted that while FIG. 3A and FIG. 3C portray the same circuit pack, FIG. 3A only shows four of the five heat sinks which all appear in FIG. 3C.

To further understand and illustrate the thermal management advantages of the present invention, the thermal performance of the circuit pack configuration shown in FIG. 3A and FIG. 3C was modeled using ICEPAK™ computational fluid dynamics (CFD) software (which allows for the analysis of the interrelationship of system components and how placement of the components on a circuit board affects the thermal behavior of the system). The ICEPAK™ CFD software solves conduction problems (e.g., heat-transfer problems concerning the conduction of heat through solid materials) and convection problems (e.g., heat-transfer problems concerning the transfer of heat into the moving air), and thus yields temperature profiles throughout each of the examined heat-transfer structures. From the temperature profiles, thermal resistances are computed to enable a comparison of the performances of the various structures.

The circuit pack configuration, as shown in FIG. 3A and FIG. 3C, included the following model devices: (1) Device 315-1 (see FIG. 3C), an FPGA, model XCV100E commercially available from Xilinx Corp., having an associated heat sink with the following: base plate lateral dimensions 17.1 mm×17.1 mm and 8 heat-transfer fins (0.7 mm thick); (2) Device 315-2 (see FIG. 3C), a clock/recovery circuit, model VSC8123RB commercially available from Vitesse Semiconductor Corp., having an associated heat sink with the following: base plate lateral dimensions 24.2 mm×24.2 mm base and 8 heat-transfer fins (0.7 mm thick); (3) Device 315-3 (see FIG. 3C), a transceiver, model S3067TB20, commercially available from Applied Micro Circuits Corp., having an associated heat sink with the following: base plate lateral dimensions 30.3 mm×23.8 mm base and 11 heat-transfer fins (0.7 mm thick); (4) Device 315-4 (see FIG. 3C), a laser driver, model VSC7928RA, commercially available from Vitesse Semiconductor, having an associated heat sink with the following: base plate dimensions 9.9 mm×15.0 mm base and 4 heat-transfer fins (0.7 mm thick); and (5) Device 315-5 (see FIG. 3C), a laser, model FU-48SFS1, commercially available from Mitsubishi Electric Corp., having an associated heat sink with the following: base plate lateral dimensions 24.4 mm×50.9 mm base and 11 heat-transfer fins (1.0 mm thick).

The following Table 1 shows the results obtained in comparing junction temperatures (i.e., the temperatures inside the IC packages, at the semiconductor device therein) calculated for (1) a heat transfer assembly having the configuration as shown in FIG. 1C; and (2) the heat transfer assembly in accordance with the present invention as illustratively shown in FIG. 2B.

TABLE 1

| Device shown FIG. 3C | Heat Transfer Assembly of FIG. 1C | Heat Transfer Assembly of the Present Invention |
|---|---|---|
| Device 315-1 | 25.70° C. | 36.88° C. |
| Device 315-2 | 47.15° C. | 41.86° C. |
| Device 315-3 | 29.31° C. | 28.86° C. |
| Device 315-4 | 42.17° C. | 39.97° C. |
| Device 315-5 | 30.99° C. | 30.30° C. |

The following Table 2 shows inlet-outlet pressure drop for the same configurations of Table 1:

TABLE 2

| Inlet-outlet pressure drop | 20.3 N/m$^2$ | 14.6 N/m$^2$ |
|---|---|---|

As can be seen from the results of Table 1 and Table 2 above, all but one of the devices operate cooler using the heat transfer device of the present invention and the inlet-outlet pressure is substantially reduced. The one device which operated hotter was due to the fact that during testing the thermal connection to the cooling airflow was removed in recognition that this particular device could operate safely at the higher operating temperatures, and it did not therefore require the thermal management improvements of the present invention. As will be appreciated, replacing the large heat transfer fin structure shown in FIG. 1C with the smaller heat sinks of the present invention reduces the flow impedance which, in turn, results in the lower pressure drop.

Figure 4:
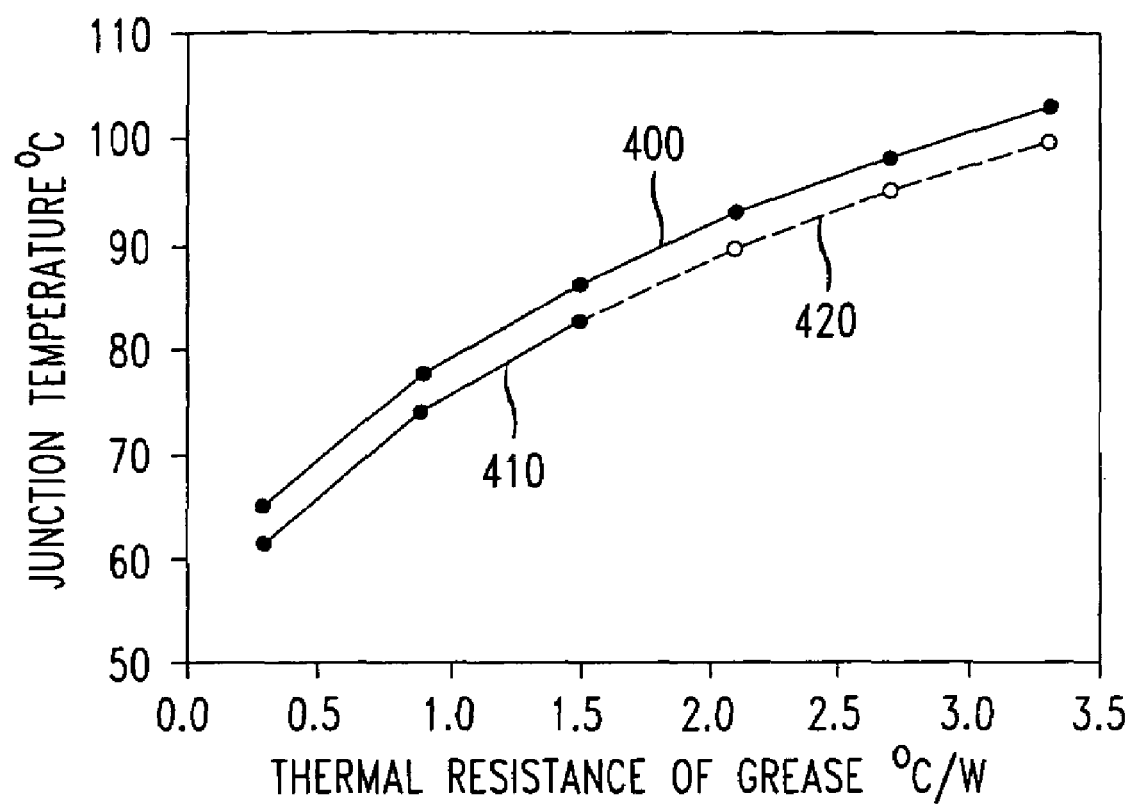
FIG. 4 shows a graph illustrating a comparison of a range of plausible computed thermal resistance values between the known heat transfer device of FIG. 1C and a heat transfer device configured in accordance with the principles of the present invention as illustratively shown in FIG. 2A.

FIG. 4 shows a graph illustrating a comparison of a range of plausible computed thermal resistance values between the known heat transfer device of FIG. 1C and a heat transfer device configured in accordance with the principles of the present invention as illustratively shown in FIG. 2A. In particular, the comparison of FIG. 4 shows plot 400 of junction temperature vs. the thermal resistance of the grease layer that fills gap 140 in FIG. 1C, as well as plots 410 and 420, which show the junction temperature vs. the thermal resistance of the equivalent layer of grease in the heat-transfer device of the present invention as shown in FIG. 2A (i.e., between heat-transfer block 202 and IC 201). As shown in FIG. 4, the horizontal axis represents thermal impedance, or, equivalently, the thickness of the grease layer between the heat transfer block and the top of the heat source. As can be seen from such results, the junction temperature in plot 410 (plot 420 is shown in dotted line fashion illustrating only that these values are not realistically expected due to the thermal management advantages of the present invention) is reduced by approximately 3.5° C. for all values of thermal resistance. Moreover, as seen in plot 400, the impedance can reach 3° C./W or higher due to the relatively large air gap which results in the assembly shown in FIG. 1C and described above. In contrast, in accordance with principles of the invention, the expected grease resistance of the FIG. 2A assembly will not exceed 1° C./W thereby resulting in a potential reduction in junction temperature of 40° C.

The foregoing merely illustrates the principles of the invention. It will thus be appreciated that those skilled in the art will be able to devise various arrangements which, although not explicitly described or shown herein, embody the principles of the invention and are within its spirit and scope. For example, one skilled in the art, in light of the descriptions of the various embodiments herein, will recognize that the principles of the present invention may be utilized in widely disparate fields and applications. All examples and conditional language recited herein are intended expressly to be only for pedagogical purposes to aid the reader in understanding the principles of the invention and are to be construed as being without limitation to such specifically recited examples and conditions. Moreover, all statements herein reciting aspects and embodiments of the invention, as well as specific examples thereof, are intended to encompass functional equivalents thereof.

We claim:

1. A heat transfer device, said heat transfer device comprising:
    a plurality of heat sources;
    an EMI shield enclosure having a lid;
    a heat-dissipating structure that is a heat sink to a particular one heat source of the plurality of heat sources; and
    a gasket disposed between, and in contact with, said heat-dissipating structure and a select area of the EMI shield enclosure; and
    wherein said gasket is mechanically-compliant and electrically-conductive; and
    wherein part of the heat sink protrudes through the lid via an opening in the lid.

2. The heat transfer device of claim 1, wherein said select area of said EMI shield is a portion of said lid and said gasket is integral with said EMI shield enclosure.

3. The heat transfer device of claim 1, wherein said plurality of heat sources are mounted on a printed circuit board, and said EMI shield enclosure provides an enclosure to said printed circuit board.

4. The heat transfer device of claim 1, wherein said heat sink has a plurality of heat-transfer fins, said plurality of heat-transfer fins extending through said lid of said EMI shield enclosure.

5. The heat transfer device of claim 1, wherein said particular one heat source is an integrated circuit.

6. A heat transfer device comprising:
    a heat-dissipating structure thermally connected to a particular one heat source of a plurality of heat sources, and
    a gasket disposed between, and in contact with, said heat-dissipating structure and a select area of an EMI shield enclosure; and
    wherein said gasket is mechanically-compliant, electrically-conductive and integral with said EMI shield enclosure; and
    wherein the heat transfer device comprises:
    a plurality of heat-dissipating structures, each one of said heat-dissipating structures being in thermal contact with a different one of said heat sources;
    a plurality of gaskets such that each gasket is disposed between, and in contact with, a different one of said heat sources and a particular area of said EMI shield enclosure; and
    wherein said gaskets are mechanically-compliant, electrically-conductive, integral with said EMI shield enclosure and compensate for any height variations between said mounted heat sources in said EMI shield enclosure.

7. The heat transfer device of claim 6, wherein said gaskets are of a uniform size and said heat-dissipating structures are of a variable size.

8. The heat transfer device of claim 6, wherein said thermal contact between at least one of said heat-dissipating structures and its associated said different one of said heat sources includes a thermal grease layer.

9. The heat transfer device of claim 1, wherein said EMI shield enclosure and said heat sink are formed from aluminum, and said gasket is formed from a nickel-graphite-filled silicone elastomer.

10. The heat transfer device of claim 6, wherein said plurality of gaskets form a compliant layer, within said EMI shield enclosure, which is external of a thermal path associated with said plurality of heat sources.

11. The heat transfer device of claim 6, wherein each heat-dissipating structure of said plurality of heat-dissipating structures has a plurality of heat-transfer fins which extend through said EMI shield enclosure and are exposed to an airflow external to said EMI shield enclosure.

12. A circuit packet assembly comprising:
a printed circuit board (PCB);
a plurality of integrated circuits mounted on said PCB;
an EMI shield, said EMI shield providing an enclosure to said PCB;
a plurality of heat sinks, each one of said heat sinks being associated with, and thermally connectable to, a different one integrated circuit of said plurality of integrated circuits;
a plurality of gaskets, each one of said gaskets being disposed between, and in contact with, a particular one heat sink of said plurality of heat sinks and said EMI shield; and
wherein said gaskets are mechanically-compliant, electrically-conductive, form part of said EMI shield and compensate for any height variations between said mounted integrated circuits within said EMI enclosure.

13. The circuit pack assembly of claim 12, wherein at least one of said heat sinks has a plurality of heat-transfer fins, said plurality of heat-transfer fins extending through a select area of said EMI shield.

14. The circuit pack assembly of claim 13, wherein said gaskets are of a uniform size and said heat sinks are of a variable size.

15. The circuit pack assembly of claim 14, wherein said thermal connection between at least one of said heat sinks and its associated said different one integrated circuit includes a thermal grease layer.

16. A heat transfer method for use with an EMI shield, the method comprising the steps of:
thermally connecting a first heat-dissipating structure to a first heat source, and thermally connecting a second heat-dissipating structure to a second heat source, said first and said second heat-dissipating structures each having at least one heat-transfer fin; and
disposing a first gasket between, and in contact with, said first heat-dissipating structure and a first select area of said EMI shield such that said heat-transfer fin of said first-heat dissipating structure extends through said first select area of said EMI shield; and
disposing a second gasket between, and in contact with, said second heat-dissipating structure and a second select area of said EMI shield such that said heat-transfer fin of said second heat-dissipating structure extends through said second select area of said EMI shield; and
wherein said first and said second gaskets are mechanically-compliant, electrically-conductive, integral with said EMI shield and compensate for any height variations between said first heat source and said second heat source within said EMI shield.

17. The heat transfer method of claim 16 further comprising:
providing an airflow, external to said EMI shield, which is exposed to said extended heat-transfer fin of said first heat-dissipating structure and said extended heat-transfer fin of said second heat-dissipating structure.

18. The heat transfer method of claim 16, wherein said second heat-dissipating structure is thermally connected to both said second heat source and at least a third heat source.

19. The heat transfer method of claim 16, wherein said thermally connecting operation further comprises:
applying a thermal grease layer between said first heat source and said first heat-dissipating structure.

* * * * *